United States Patent [19]

Kauffman et al.

[11] 4,286,265
[45] Aug. 25, 1981

[54] BAR GRAPH DISPLAY PANEL AND SYSTEM FOR DISPLAYING ANALOG VALUES THEREIN

[75] Inventors: Samuel L. Kauffman, Sunnyvale, Calif.; John O. Morin, Madison, Conn.

[73] Assignee: Burroughs Corporation, Detroit, Mich.

[21] Appl. No.: 20,885

[22] Filed: Mar. 15, 1979

Related U.S. Application Data

[60] Continuation of Ser. No. 849,555, Nov. 8, 1977, abandoned, which is a division of Ser. No. 574,446, May 5, 1975, Pat. No. 4,163,971.

[51] Int. Cl.³ ......................... G01D 7/00; H01J 17/48
[52] U.S. Cl. ..................... 340/754; 313/217; 313/494; 315/169.4; 340/713; 340/753; 340/773
[58] Field of Search ............... 340/753, 754

[56] References Cited

U.S. PATENT DOCUMENTS

| Re. 30,095 | 9/1979 | Miller | 340/753 X |
|---|---|---|---|
| Re. 30,172 | 12/1979 | Saxon | 340/753 X |
| 2,925,530 | 2/1960 | Engelbart | 340/768 X |
| 3,775,764 | 11/1973 | Gaur | 340/768 |
| 3,875,474 | 4/1975 | Ogle et al. | 340/714 |
| 3,961,217 | 6/1976 | Frischer | 340/753 X |
| 3,973,166 | 8/1976 | Maloney | 340/754 |
| 4,163,971 | 8/1979 | Morin et al. | 340/754 |

*Primary Examiner*—David L. Trafton
*Attorney, Agent, or Firm*—Robert A. Green

[57] ABSTRACT

The display panel comprises a gas-filled envelope which contains a series of aligned cathode electrodes, an anode for the series, and a reset cathode at each end of the series of cathodes. The system includes a driving circuit which repeatedly scans along the series of aligned cathode electrodes by sequentially grounding the aligned electrodes and repeating the process cyclically. Within each cycle, a pulse width modulator energizes the anode, which is opposite the cathode electrodes, for a period of time corresponding to an input value. Sequential glow discharges thus occur between the cathodes and the anode over a portion of the anode length. The discharges occur with sufficient rapidity so that they are observed as an illuminated portion of a bar formed by the electrodes. The panel is particularly suited for producing two illuminated bands or bars separated from each other. Desired upper and lower set point limits for the input quantity determine the lengths of the bands and the separation between them. The separate bands are initiated from opposite ends of the series of cathode electrodes by first energizing the reset cathodes. The driver forms one band from one end of the aligned electrodes and the other band from the other end of the aligned electrodes.

4 Claims, 3 Drawing Figures

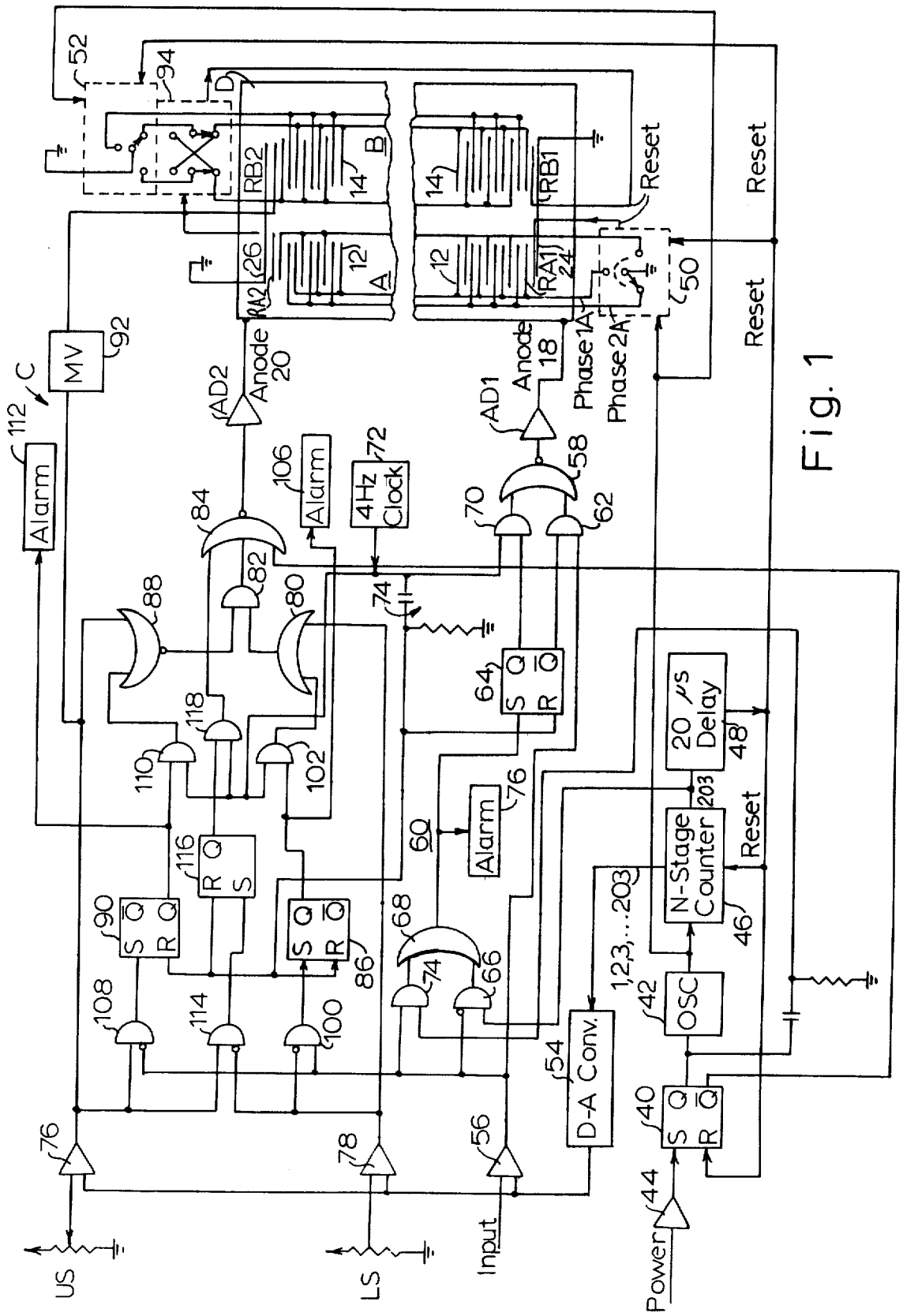

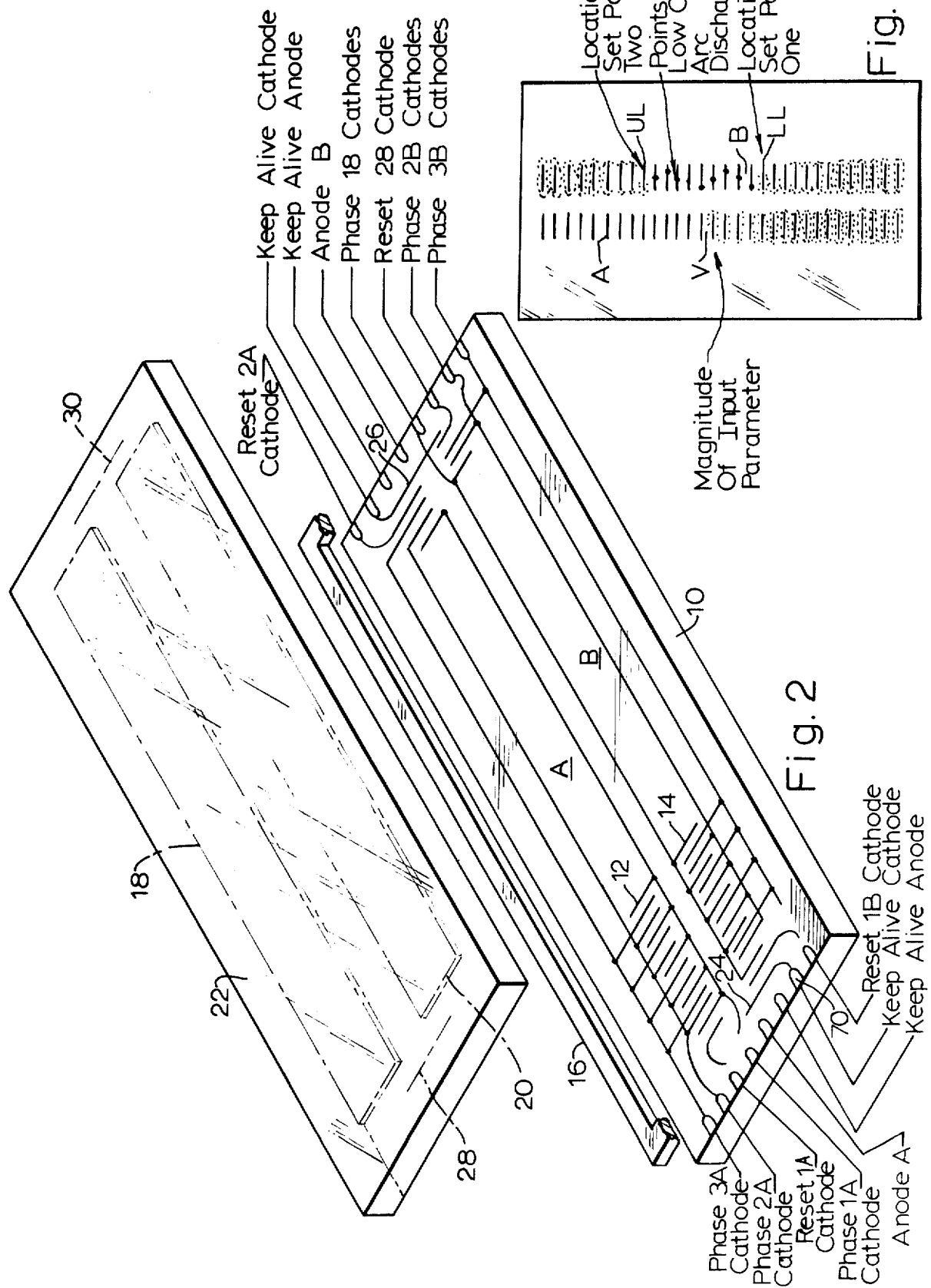

BAR GRAPH DISPLAY PANEL AND SYSTEM FOR DISPLAYING ANALOG VALUES THEREIN

CROSS REFERENCE TO RELATED APPLICATIONS

This is a continuation of application Ser. No. 849,555, filed Nov. 8, 1977, now abandoned, which was a division of application Ser. No. 574,446 filed May 5, 1975 and now U.S. Pat. No. 4,163,971.

BACKGROUND OF THE INVENTION

This invention relates to a panel for displaying analog limits and values, and particularly to a bar graph analog display panel for displaying a value which may vary between certain limits and must be continuously monitored.

In industrial processes, it is frequently necessary continuously to measure and monitor conditions such as temperatures, pressure, flow, etc., which are critical to the process. Frequently, transducers convert the parameter to be measured to an electrical value which is then displayed by a D'Arsonval meter movement. Ideally, in a D'Arsonval meter movement, the displacement of a pointer is proportional to the magnitude of an input current. This current is a known function of the input parameter to be measured so that the pointer displacement is a measure of the input parameter. Thus, the information is displayed in the form of a displacement which is continuously analogous to the input parameter.

Another electronic device which generates a displacement analog of an electrical value transduced from a parameter to be measured is a servo indicator. Here, a motor drives an indicator, and an electrical equivalent of the motor position is compared with the input value. When the motor reaches a null balance, the indicator displays a value corresponding to the parameter to be measured.

Process parameters may also be displayed digitally. A multi-digit number is displayed which indicates the value of the input parameter.

All of these displays have certain disadvantages. Both the D'Arsonval movement and the servo system involve the use of moving parts which are susceptible to destruction or failure as a result of shocks. Servo indicators are subject to hysteresis errors. An all-electronic digital indicator is rugged and has no moving parts. However, it requires mental calculation on the part of the observer to determine how far the value has strayed from an ideal value or from between desired limits.

Analog displays yield more information about a parameter than just its magnitude. By observing the pointer or scale, it can be noted that the variable is steady or drifting up and down and that it is, or is not, near some particular reference point. This type of information is generally called "rate information" or "trend information". Trend information is particularly useful when many instruments are grouped together, all of which are monitoring different parameters of a process. By viewing the magnitudes and trends of all measurements, a clearer picture of the process can be reached than by observing single measurements only. Furthermore, in many cases, it is desirable to know if a measured parameter is close to a danger point. By providing an index mark, it is possible to spot an approaching problem quickly using trend information.

Recently a new type of display device has been developed and marketed under the trademark SELF-SCAN. Basically, this is composed of a multi-element gas discharge device in which the area of illumination is moved around a display by selective excitation of the elements. In one version, a large number of cathode elements are printed on an insulating substrate. A transparent cover for this pattern carries a transparent anode surface on its underside. The interior between the cover and the pattern is filled with an ionizable gas. A glow discharge is generated between the anode plate and the cathode elements. A keep-alive anode forms a continuous discharge with a keep-alive cathode. The gap between them provides a continuous source of metastable ions. The system is energized so that the glow at any electrode can transfer only between adjacent gaps. A reset cathode near the keep-alive gap transfers the glow to a reset gap formed between the reset cathode and the transparent anode. The remaining cathodes are connected in three groups so that the glow can be constrained to travel along the display by opening the cathode which has the glow and grounding the next cathode in the desired phase sequence. The length of the illuminated area represents a quantized indication of an input parameter having trend information. Such devices have a number of disadvantages in the display of monitored analog information. They merely display a process parameter without displaying the range or limits within which this process parameter may vary. While the variable range may be painted behind the bar, it is desirable that the limits of this range be made variable so that they can be reset.

An object of the invention is to improve the display device itself so that it is capable of furnishing variable range or limit information.

SUMMARY OF THE INVENTION

According to a feature of the invention, the above object is attained in whole or in part, by forming a row of cathode display electrodes in an enclosure having an ionizable gas and spacing an anode electrode within the enclosure close enough to the cathode display electrodes to permit a visible discharge of a given intensity when a predetermined discharge voltage is applied between a cathode display electrode and the anode. Also, reset electrodes are provided at both ends of the row of cathode display electrodes so that successive scanning can start from either end of the bar. Circuit means energizes the anode electrode and scans the cathode display electrodes from one reset electrode at one end of the row until a band whose length corresponds to one set point value is illuminated, and then ceases scanning until the remaining portion of the scan cycle would produce an illuminated band from the second set point value to the upper limit.

DESCRIPTION OF THE DRAWINGS

FIG. 1 is a plan view of a display panel embodying the invention and a schematic and logic diagram of a system for operating the panel;

FIG. 2 is an isometric drawing of a display panel used in FIG. 1 and embodying features of the invention; and FIG. 3 is a schematic representation of the unit in FIG. 2 illustrating the manner in which the unit may be illuminated.

DESCRIPTION OF THE PREFERRED EMBODIMENTS

In FIG. 1, a drive circuit C operates a bar graph display D. The bar graph display D is shown only partially in FIG. 1. Details of the display D appear in FIG. 2.

In FIGS. 1 and 2, the upper surface of a substrate 10 supports two rows of two hundred three aligned printed wiring cathodes 12 and 14 which form two bar graphs A and B of the display D. Every third cathode 12 is interconnected by three conductors to form phase 1A cathodes, phase 2A cathodes, and phase 3A cathodes as shown. Similarly, three separate conductors connect respective third ones of the cathodes 14 to form phase 1B cathodes, phase 2B cathodes, and phase 3B cathodes.

An insulating spacer 16 in the shape of a frame rests on the top peripheral edge of the substrate 10. The spacer separates the cathodes 12 and 14 from two transparent anodes 18 and 20 printed over the areas shown on the bottom face of a transparent cover plate 22. The anode 18 overlies the cathodes 12, and the anode 20 overlies the cathodes 14. The substrate 10, spacer 16 and plate 22 are sealed to form a gas-tight unit which contains an ionizable gas such as neon.

Two reset cathodes RA1 and RA2 are printed on the substrate 10 at the extreme ends of the cathodes 12 and connected to the substrate edge. Reset cathodes RB1 and RB2 are printed on the substrate 10 at the ends of the cathodes 14 and connected to opposite end edges of the substrate. The anodes 18 and 20 are sufficiently long to overlie the reset cathodes.

Extending between the reset cathode RA1 and the reset cathode RB1 but spaced therefrom by one intercathode step is a keep-alive cathode 24 printed on the substrate 10 and connected to a terminal. Extending from the reset cathode RA2 to the reset cathode RB2 is a second keep-alive cathode 26, also spaced from each of the reset cathodes by one intercathode step. Above the keep-alive cathodes 24 and 26 on the under surface of the plate 22 are keep-alive anodes 28 and 30 connected to otherwise unidentified terminals.

To drive the bar graph display D, the driver circuit C establishes a 250 volt potential between the keep-alive cathode 24 and the keep-alive anode 28, as well as between the keep-alive cathode 26 and the keep-alive anode 30, sufficient to ionize the gases between the elements 24 and 28 and between the elements 26 and 30 and to maintain the gas in its ionized state.

The keep-alive gaps between the keep-alive anodes and cathodes provide a continuous source of metastable ions in response to the power supplied. This provides the starting point for the entire operation.

In order to illuminate the portion of the bar A corresponding to an analog value, circuit C grounds the reset cathode RA1, and a positive potential is applied to the anode 18. This potential, together with the internal geometry of the display and the gas mixture, is selected so that the glow at any electrode can transfer between, but only between, adjacent anode-to-cathode gaps. The glow in the keep-alive gap at the cathode 24 now transfers to the anode-cathode reset gap. The driver circuit C then grounds the phase 1A cathodes and ungrounds or opens the reset cathode RA1. The glow now transfers from the reset cathode RA1 to the nearest phase 1A cathode. The circuit C then grounds the phase 2A cathodes and transfers the glow to the nearest phase 2A cathodes. Similarly, the driver circuit C then grounds the phase A3 cathodes and opens the phase A2 cathodes to transfer the glow to the nearest phase A3 cathode. By continuously grounding the phase 1, phase 2, and phase 3 cathodes in sequence and ungrounding the other cathodes, the driver C constrains the glow to travel along the display. Effectively, the driver circuit C opens the cathode which has the glow and grounds the next cathode in the desired phase sequence. The travel of the glow along the bar A continues until a point is reached that corresponds to the analog of the value to be displayed. The anode 18 is then de-energized, and the continuing scan along the cathodes fails to produce a glow.

After the circuit C has grounded the cathodes 12 a total number of two hundred three times so that the scan reaches the top, the driver circuit C waits to be recycled, at which time it again grounds the reset cathode RA1 and repeats the sequence. The basic parameters of the system establish the length of an entire display time within each cycle to be between ten and twenty-five milliseconds. In a preferred embodiment, the cycles are synchronized with a power line of 50 or 60 Hz. The cycles and the scanning speed, i.e., the intergap glow transfers, are sufficiently rapid and frequent so that a portion of the bar A corresponding to the analog value of the input voltage appears to be continuously illuminated. That is, the persistance of an observer's eye sees an illuminated bar portion extending from the reset cathode through the furthest cathode at which a glow has been introduced by grounding of the cathode and operation of the anode 18. This is shown in FIG. 3.

The system of FIG. 1 also displays a visual range or limits within which the input value shown in bar A is supposed to vary. The driver circuit C does this by illuminating the bottom portion of the bar B from the reset cathode RB1 to a lower set point established by a lower set point control LS and by illuminating the top of the bar B from the reset cathode RB2 down to an upper set point established by an upper set point control US in the driver circuit C. The unilluminated portion in the bar B represents the range. As shown in FIG. 3, the bar A is illuminated to a value V and the bar B between the bottom and a lower location LL and between the top and an upper location UL. If the system is to monitor a process variable that is permitted to vary between the ranges established between the upper set point and lower set point shown as UL and LL, an observer can note that the value V is between the set points. If the value V falls below the value LL or rises above the value UL, the observer is informed that the variable to be monitored has increased or decreased beyond the permitted range. In order to inform an observer more readily that the input value has increased or decreased beyond the permitted range, either the upper or the lower illuminated portion of the bar B is flashed when the input value causes the illuminated portion of the bar A to fall outside the permissible range.

In the driver circuit C, a flip-flop 40 synchronizes an oscillator 42 to a power line through a buffer amplifier 44. The resulting synchronization prevents stroboscopic interaction between ambient lighting and the display. When a positive zero crossing of the power line voltage occurs, buffer amplifier 44 enables the flip-flop 40, which in turn starts the oscillator 42. The latter produces clock pulses which drive an N stage counter 46. When the counter reaches the number 203, it triggers a 20 microsecond delay generator 48 which creates a reset pulse. At the end of this measurement cycle, the reset pulse disables flip-flop 40 which turns off the oscillator 42 until the next positive zero crossing of the power line at the buffer amplifier 44. The oscillator frequency is chosen to ensure that a measurement cycle is shorter than the interval between the power line voltage positive zero crossings. In this case, the measurement cycle is less than 16 ms, whereas the positive zero crossings occur every 16⅔ ms for 60 Hz or 20 ms for 50 μs. The number 203 equals the number of electrodes 12 and also the number of electrodes 14 in the respective bars A and B. One of these cathodes represents zero on the scale. Therefore, to indicate an overscale condition, there are 203 states in the counter 46, and N must equal at least 203. Since the length of the measurement cycle is N pulses, the oscillator 42 produces N pulses in somewhat less time than one cycle of the power line. Therefore, the oscillator 42 operates at a frequency greater than N times the power line frequency.

The oscillator 42 drives two 3-phase cathode drivers 50 and 52, and an N-stage counter 46. The drivers 50 and 52 are illustrated as rotating selector switches which step one position for each pulse applied by the oscillator 42. In the successive positions of the driver 50, it successively and repeatedly grounds the phase 1A, phase 2A, and phase 3A cathodes. When the reset cathode has been grounded and the glow transferred from the keep-alive cathode, this repeatedly transfers the ionization glow from between the reset gap through the successive gaps along the bar A. While the driver 50 is shown as a rotating selector switch, it may be representative of any type of logic arrangement capable of performing this function. In a preferred embodiment, suitable buffer amplifiers exist between the driver 50 and the cathodes 12. The driver 52 performs the same function with the cathodes 14. However, intervening between the driver 52 and the cathodes, or any buffer amplifiers which may be used, is a phase reversing circuit shown as a double pole, double throw switch, which may represent any suitable logic circuit that performs this function. The driver 50 advances the input display, while the driver 52 advances the set point display.

The N stage counter 46 drives an N level digital-to-analog converter 54. The latter provides an output voltage proportional to the number in the counter. Thus, as the count increases from zero on each clock pulse from the N stage counter, the converter exhibits a voltage which increases linearly with the clock pulses or time, one level of increase for each clock pulse. Hence, each clock pulse advances the display one bar element and increases the converter output one unit of voltage.

The output of the digital-to-analog converter 54 is applied to a comparator 56 which compares this voltage to the input voltage. The input voltage is a preconditioned version of a parameter to be measured. A transducer, compressor, expander or other device conditions the input signal for operation in this environment. As long as the input voltage exceeds the converter 54 voltage, the comparator 56 produces a logic zero signal. During this time, a NOR gate 58 produces a logic 1 that permits an anode driver AD1 to apply the required glow-producing anode voltage at the anode 18. As long as this occurs, the anode 18 remains positive and the driver 50 advances the display of the discharge glow from cathode to cathode along the bar A. The NOR gate 58 forms part of an over and under range flashing circuit 60 through which the output of the comparator 56 passes.

When the output of converter 54 equals or exceeds the input voltage, the comparator 56 produces a logic 1 signal. An AND gate 62 combines this signal with a logic 1 signal from the $\overline{Q}$ terminal of a normally reset S-R flip-flop 64 to produce a logic 1 signal. The NOR gate 58 then produces a logic zero signal that causes the anode driver AD1 to ground the anode 18. The display of glow discharge along the bar A ceases advancing. The portion of the bar A along which the glow advanced is proportional to the input signal. The clock pulse 42 continues ineffectively to drive the driver 50 until the counter 46 advances to the number 203. After a 20 microsecond delay produced by the delay 48, the flip-flop 40 is reset and the oscillator 42 stops generating clock pulses.

Upon the next zero crossing of the voltage in the power line, the amplifier 44 again sets the flip-flop 40 and the process is repeated at the rate of the power line frequency. The continued glow advance over the section of the bar proportional to the value of the input produces what appears to be a persistent bar-shaped glow along the bar A corresponding to the value of the input.

An over-range and under-range comparison is made by examining the state of the comparator 56 at reset time and at full scale, as discussed more fully in parent application, Ser. No. 574,446 referred to above.

In summary, the bar B displays high and low set points, between which the indication in the bar A is supposed to lie for proper operation. To generate the set points, two potentiometers US and LS generate upper and lower set point command voltages. Comparators 76 and 78 compare these set point voltages with the output of the converter 54. From the start of each counting cycle after reset, the comparator 78 produces a logic zero until the lower set point is reached. Similarly, the comparator 76 produces a logic zero until the higher set point is reached. An OR gate 80 passes the logic zero value through an AND gate 82 and a NOR gate 84. An anode driver AD2 energizes the anode 20. This occurs as the driver 52 scans the bar B from bottom to top by advancing the glow from the reset cathode RB1 along the phase 1B cathodes, phase 2B cathodes, and phase 3B cathodes (14). When the lowest set point is reached, the comparator 78, which operates as a pulse width modulator, produces a logic 1 output. In the meantime, the comparator 76 is still producing a logic zero output. The logic 1 from the comparator 78 passes through OR gate 80 and the AND gate 82. The logic 1 at the input of the NOR gate 84 constrains the anode drive AD2 to inhibit the anode 20 voltage so that glow advance along the bar B stops. During this time, the logic zero output from the comparator 76 has disabled a NOR gate 88 which has enabled the AND gate 82. When the converter 54 potential reaches the upper set point at the potentiometer US, the comparator 76 produces a logic 1. The NOR gate 88 produces a logic zero that turns off gate 82 and prevents the NOR gate 84 from further inhibiting the anode driver 82. Thus, the anode 20 is energized. At the same time, a monostable multivibrator 92 produces a pulse that reverses the polarity on a switch 94 shown as a double pole, double throw switch but capable of being embodied as a logic circuit. This reverses the phase of the driver circuit 52. At the same time, the pulse from the monostable 92 actuates the reset cathode RB2 so that the various phases of cathodes 14 are scanned downwardly. As long as the anode 20 is energized, illumination of the ionizable gas between the gaps from the cathodes 14 to the anode 20 continues in sequence. When the N stage counter reaches the count 203, flip-flop 40 is reset which produces an anode inhibiting voltage at NOR gate 84 until the next zero crossing from the power line.

Because the bar B was illuminated by scanning from the top only from the time the converter 54 voltage reached the upper set voltage to the end of the count 203, only the portion of the bar from the top to the upper set voltage is illuminated beyond the earlier illumination of the portion below the lower set voltage.

Thus, when the lower set point is reached, signals from the comparator 78 hold the set point display cathodes in the reset mode without the anode energized. When the upper set point is reached, another signal from the comparator 76 reverses the counting sequence of the cathode drivers. At this time, the upper reset cathode is grounded, the anode energized and the driver 52 reversed. A discharge has now been formed at the top of the set point display bar B and counts down until full scale is reached and the measurement cycle ended. Therefore, the length of the bar illuminated to represent the upper set point is actually equal to the difference between the full scale and the upper set point.

Parent application Ser. No. 574,446 is incorporated herein by reference. Such parent application, as already noted, discloses an alarm circuit for operating when the input voltage falls below the low set point voltage or exceeds the high set voltage.

What is claimed is:

1. A display panel for displaying bars of light comprising
    a gas-filled envelope containing a series of linear display cathode elements adapted to be viewed,
    said series having a first end defined by the first display cathode and a second end defined by the last display cathode,
    two reset cathodes, one positioned adjacent to the first display cathode at said first end of said series and the other positioned adjacent to the last display cathode at the second end of said series, said reset cathodes being adapted to provide excited particles for said first and last cathodes for use in initiating scanning cycles of said series of cathodes at said first and last cathodes separately,
    a keep-alive cell adjacent to each reset cathode, and
    an anode electrode means in operative relation with said series of cathodes.

2. An indicating apparatus, comprising
    an envelope,
    a plurality of aligned operating electrodes in the envelope,
    conductive means connecting said operating electrodes into a plurality of sets greater than two, the operating electrodes of each of the sets being uniformly interleaved with the operating electrodes of others of the sets, said operating electrodes forming a band,
    a first reset electrode spaced from one end of the band and unconnected with any of the operating electrodes, a second reset electrode spaced from the other end of the band and unconnected with any of the operating electrodes,
    an electrode means within the enclosure spaced from the aligned electrodes and the reset electrodes but close enough to maintain a visible electric discharge of a given intensity when a predetermined voltage is applied between an operating electrode and said electrode means,
    said electrode means extending along the band and the reset electrodes,
    first discharge gap-forming means adjacent but spaced from the reset electrodes and the electrode means at one end of the band, second discharge gap-forming means adjacent but spaced from the reset electrodes and the electrode means at the other end of the band, each gap-forming means having a pair of conductive members,
    said enclosure having an ionizable gas therein,
    said conductive members in each pair being spaced from each other so that, when an initiating voltage is applied between them, said members can maintain a discharge continuously,
    said conductive members and said operating electrodes and said electrode means being spaced from each other to form an operating gap between each of said operating electrodes and the electrode means and so that, when the predetermined voltage is applied between the electrode means and a reset electrode, the discharge from the discharge gap can transfer to the operating gap between the reset electrode and the electrode means, and so that, when predetermined voltages are applied sequentially to operating electrodes adjacent a gap having a discharge, the discharge can transfer from gap to gap.

3. An apparatus as in claim 2, wherein said electrode means is composed of a single conductive strip extending from one end of the band to the other.

4. An apparatus as in claim 3, wherein said strip is translucent.

* * * * *